United States Patent
Bae et al.

(10) Patent No.: US 8,492,068 B2
(45) Date of Patent: *Jul. 23, 2013

(54) METHODS OF FORMING ELECTRONIC DEVICES

(75) Inventors: Young Cheol Bae, Weston, MA (US); Thomas Cardolaccia, Newton, MA (US); Yi Liu, Wayland, MA (US)

(73) Assignee: Rohm and Haas Electronic Materials LLC, Marlborough, MA (US)

(*) Notice: Subject to any disclaimer, the term of this patent is extended or adjusted under 35 U.S.C. 154(b) by 156 days.

This patent is subject to a terminal disclaimer.

(21) Appl. No.: 12/825,134

(22) Filed: Jun. 28, 2010

(65) Prior Publication Data

US 2010/0330503 A1 Dec. 30, 2010

Related U.S. Application Data

(60) Provisional application No. 61/269,600, filed on Jun. 26, 2009, provisional application No. 61/281,681, filed on Nov. 19, 2009.

(51) Int. Cl.
*G03F 7/00* (2006.01)
*G03F 7/004* (2006.01)
*G03F 7/40* (2006.01)

(52) U.S. Cl.
USPC ............ 430/270.1; 271/273.1; 271/312; 271/330; 271/331

(58) Field of Classification Search
USPC ............ 430/270.1, 271.1, 273.1, 312, 330, 430/331
See application file for complete search history.

(56) References Cited

U.S. PATENT DOCUMENTS

| 5,100,969 | A * | 3/1992 | Yamamoto et al. | 525/327.2 |
| 8,003,295 | B2 * | 8/2011 | Hatakeyama | 430/270.1 |
| 8,067,146 | B2 * | 11/2011 | Jung | 430/311 |
| 2004/0121615 | A1 * | 6/2004 | Kaneko et al. | 438/758 |
| 2006/0003271 | A1 * | 1/2006 | Clark et al. | 430/329 |
| 2006/0127816 | A1 * | 6/2006 | Kang et al. | 430/312 |
| 2008/0063985 | A1 | 3/2008 | Jung et al. | |
| 2008/0166665 | A1 * | 7/2008 | Jung | 430/313 |
| 2009/0053657 | A1 | 2/2009 | Hatakeyama et al. | |
| 2009/0087786 | A1 | 4/2009 | Hatakeyama | |
| 2009/0155715 | A1 | 6/2009 | Chen et al. | |
| 2009/0253078 | A1 * | 10/2009 | Bekiaris et al. | 430/312 |
| 2009/0253080 | A1 * | 10/2009 | Dammel et al. | 430/324 |
| 2010/0090372 | A1 * | 4/2010 | Ishikawa et al. | 264/342 R |
| 2010/0273112 | A1 * | 10/2010 | Hata et al. | 430/325 |
| 2010/0273113 | A1 * | 10/2010 | Hata et al. | 430/325 |

FOREIGN PATENT DOCUMENTS

EP 1 975 718 10/2008
WO WO 2008/070060 6/2008

OTHER PUBLICATIONS

European Search Report corresponding to European Application No. 10 16 7369, (Jun. 2010).

* cited by examiner

*Primary Examiner* — Amanda C. Walke
(74) *Attorney, Agent, or Firm* — Jonathan D. Baskin

(57) ABSTRACT

Methods of forming electronic devices are provided. The methods involve alkaline treatment of photoresist patterns and allow for the formation of high density resist patterns. The methods find particular applicability in semiconductor device manufacture.

10 Claims, 4 Drawing Sheets

|  | Comp. 1 | Ex. 1 | Ex. 2 | Ex. 3 | Ex. 4 | Ex. 5 | Ex. 6 |
|---|---|---|---|---|---|---|---|
| Curing Bake | 180°C | 180°C | 180°C | 180°C | 180°C | 180°C | 180°C |
| Surface Treatment | No | Yes | Yes | Yes | Yes | Yes | Yes |
| Hard bake temperature after surface treatment | N/A | N/A | 120°C | 130°C | 140°C | 150°C | 180°C |
| L1 Dose (mJ/cm$^2$) | 22.0 | 22.0 | 22.0 | 22.0 | 22.0 | 22.0 | 22.0 |
| L1 Image | | | | | | | |
| L1 CD (nm) | 41.6 | 57.1 | 54.0 | 50.1 | 45.0 | 40.0 | 40.6 |
| L2 Dose (mJ/cm$^2$) | 23 | 23 | 23 | 23 | 23 | 23 | 23 |
| L2 Image | | | | | | | |
| L2 CD (nm) | 40.1 | 43.15 | 41.2 | 40.7 | 39.8 | 39.1 | 39.2 |
| Contact Hole Image | | | | | | | |
| L1 Bar CD (nm) | 38.4 | 68.3 | 52.8 | 50.3 | 48.4 | 44.1 | 36.8 |
| L2 Bar CD (nm) | 38.5 | NA | 44.3 | 45.9 | 42.9 | 44.6 | 37.7 |

FIG. 4

METHODS OF FORMING ELECTRONIC DEVICES

This application claims the benefit of priority under 35 U.S.C. §119(e) to U.S. Provisional Application Nos. 61/269,600, filed Jun. 26, 2009 and 61/281,681, filed Nov. 19, 2009, the entire contents of which applications are incorporated herein by reference.

This invention relates generally to the manufacture of electronic devices. More specifically, this invention relates to methods of forming photolithographic patterns using multiple patterning techniques. The invention finds particular use in the manufacture of semiconductor devices for forming high-density lithographic patterns and features.

In the semiconductor manufacturing industry, photoresist materials are used for transferring an image to one or more underlying layers, such as metal, semiconductor or dielectric layers, disposed on a semiconductor substrate, as well as to the substrate itself. To increase the integration density of semiconductor devices and allow for the formation of structures having dimensions in the nanometer range, photoresists and photolithography processing tools having high-resolution capabilities have been and continue to be developed.

One approach to achieving nm-scale feature sizes in semiconductor devices is the use of short wavelengths of light, for example, 193 nm or less, during exposure of chemically amplified photoresists. Immersion lithography effectively increases the numerical aperture of the lens of the imaging device, for example, a scanner having a KrF or ArF light source. This is accomplished by use of a relatively high refractive index fluid (i.e., an immersion fluid) between the last surface of the imaging device and the upper surface of the semiconductor wafer. The immersion fluid allows a greater amount of light to be focused into the resist layer than would occur with an air or inert gas medium.

The theoretical resolution limit as defined by the Rayleigh equation is shown below:

$$R = k_1 \frac{\lambda}{NA}$$

where $k_1$ is the process factor, $\lambda$ is the wavelength of the imaging tool and NA is the numerical aperture of the imaging lens. When using water as the immersion fluid, the maximum numerical aperture can be increased, for example, from 1.2 to 1.35. For a $k_1$ of 0.25 in the case of printing line and space patterns, 193 nm immersion scanners would only be capable of resolving 36 nm half-pitch line and space patterns. The resolution for printing contact holes or arbitrary 2D patterns is further limited due to the low aerial image contrast with a dark field mask wherein the theoretical limit for $k_1$ is 0.35. The smallest half-pitch of contact holes is thus limited to about 50 nm. The standard immersion lithography process is generally not suitable for manufacture of devices requiring greater resolution.

In an effort to achieve greater resolution and to extend capabilities of existing manufacturing tools beyond theoretical resolution limits, various double patterning processes have been proposed, for example, self-aligned double patterning (SADP), litho-etch-litho-etch (LELE) and litho-litho-etch (LLE) techniques. Such techniques as typically implemented, however, suffer from one or more disadvantages. SADP processes typically involve a relatively large number of process steps, thereby adversely affecting production throughput. Product contamination and defectivity can result from LELE techniques from transport of wafers back and forth between photolithography and etching processing modules, and from etching and resist removal processes themselves. LLE procedures involve formation and stabilization of a first lithographic (L1) resist pattern followed by formation of a second lithographic (L2) pattern. Various resist stabilization techniques have been proposed such as ion implantation, UV curing, thermal hardening, thermal curing and chemical curing. U.S. Patent Application Publication No. US 2008/0199814 A1, to Brzozowy et al, discloses an overcoat chemical curing technique in which the resist pattern is coated with a fixer solution comprising a solvent, a fixer compound containing at least two functional groups reactive with an anchor group in a resist polymer, and optional additives such as catalysts, surfactants and polymers. While LLE processes involve fewer process steps than SADP and LELE, it can be difficult to avoid: pattern deformation during resist stabilization; intermixing between L1 and L2 resist layers during the L2 resist coating/soft bake process; and development of L1 patterns during the L2 exposure/develop process.

There is a continuing need in the art for multiple patterning processes which address one or more of the foregoing problems associated with the state of the art.

In accordance with a first aspect of the invention, methods of forming an electronic device are provided. The methods comprise: (a) providing a semiconductor substrate comprising one or more layers to be patterned; (b) applying a first layer of a first photosensitive composition over the one or more layers to be patterned, wherein the first photosensitive composition comprises a first resin component and a first photoactive component; (c) exposing the first layer to activating radiation through a patterned photomask; (d) developing the exposed first layer to form a first resist pattern; (e) heat treating the first resist pattern in a hardbake process; (f) treating the hardbaked first resist pattern with a material effective to make alkaline a surface of the first resist pattern; (g) applying a second layer of a second photosensitive composition over the one or more layers to be patterned and in contact with the alkaline surface of the first resist pattern, wherein the second photosensitive composition comprises a second resin component and a photoacid generator and is positive-acting; (h) exposing the second layer to activating radiation through a patterned photomask; and (i) developing the exposed second layer to form a second resist pattern.

The present invention will be discussed with reference to the following drawings, in which like reference numerals denote like features, and in which:

FIG. 1A-I illustrates a process flow for a double exposure single etch double patterning method in accordance with the invention;

FIG. 4 is a table including SEM photomicrographs and data for a double patterning method described in the Examples.

Figure 1:
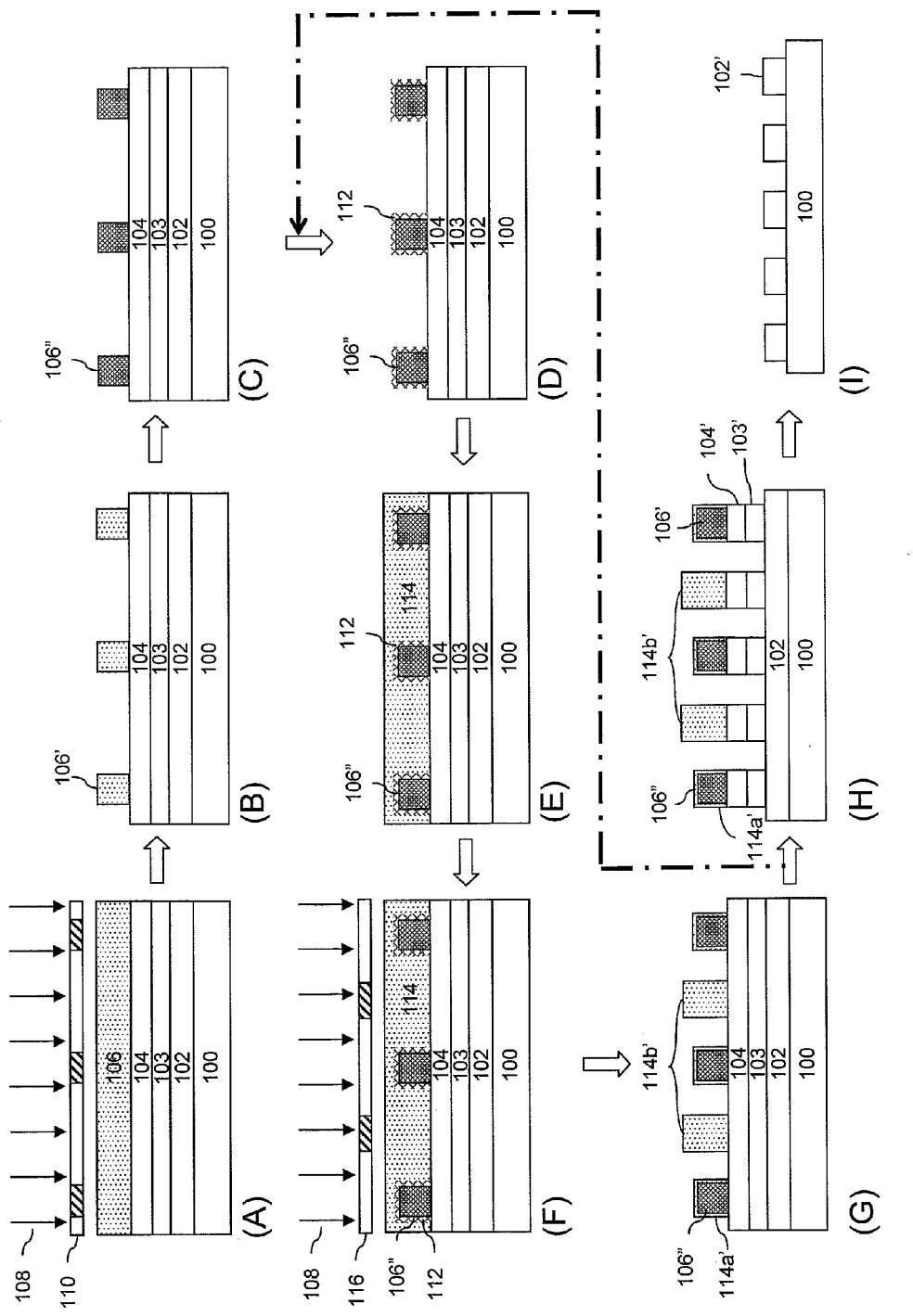

Exemplary aspects of the invention will be described with reference to FIG. 1A-I, which illustrates an exemplary litho-litho-etch double patenting process flow for forming an electronic device in accordance with the invention. FIG. 1A depicts a substrate 100 which may include various layers and features formed on a surface thereof. The substrate can be of a material such as a semiconductor, such as silicon or a compound semiconductor (e.g., III-V or II-VI), glass, quartz, ceramic, copper and the like. Typically, the substrate is a semiconductor wafer, such as single crystal silicon or compound semiconductor wafer, and may have one or more layers and patterned features formed on a surface thereof. One or more layers to be patterned 102 may be provided over the substrate 100. Optionally, the underlying base substrate material itself may be patterned, for example, when it is desired to form trenches in the substrate material. In the case of patterning the base substrate material itself, the pattern shall be considered to be formed in a layer of the substrate.

The layers may include, for example, one or more conductive layers such as layers of aluminum, copper, molybdenum, tantalum, titanium, tungsten, alloys, nitrides or silicides of such metals, doped amorphous silicon or doped polysilicon, one or more dielectric layers such as layers of silicon oxide, silicon nitride, silicon oxynitride, or metal oxides, semiconductor layers, such as single-crystal silicon, and combinations thereof. The layers to be etched can be formed by various techniques, for example: chemical vapor deposition (CVD) such as plasma-enhanced CVD, low-pressure CVD or epitaxial growth; physical vapor deposition (PVD) such as sputtering or evaporation; or electroplating. The particular thickness of the one or more layers to be etched 102 will vary depending on the materials and particular devices being formed.

Depending on the particular layers to be etched, film thicknesses and photolithographic materials and process to be used, it may be desired to dispose over the layers 102 a hard mask layer 103 and/or a bottom antireflective coating (BARC) 104 over which a photoresist layer is to be coated. Use of a hard mask layer may be desired, for example, with very thin resist layers, where the layers to be etched require a significant etching depth, and/or where the particular etchant has poor resist selectivity. Where a hard mask layer is used, the resist patterns to be formed can be transferred to the hard mask layer which, in turn, can be used as a mask for etching the underlying layers 102. Suitable hard mask materials and formation methods are known in the art. Typical materials include, for example, tungsten, titanium, titanium nitride, titanium oxide, zirconium oxide, aluminum oxide, aluminum oxynitride, hafnium oxide, amorphous carbon, silicon oxynitride and silicon nitride. The hard mask layer 103 can include a single layer or a plurality of layers of different materials. The hard mask layer can be formed, for example, by chemical or physical vapor deposition techniques.

A bottom antireflective coating 104 may be desirable where the substrate and/or underlying layers would otherwise reflect a significant amount of incident radiation during photoresist exposure such that the quality of the formed pattern would be adversely affected. Such coatings can improve depth-of-focus, exposure latitude, linewidth uniformity and CD control. Antireflective coatings are typically used where the resist is exposed to deep ultraviolet light (300 nm or less), for example, KrF excimer laser light (248 nm), ArF excimer laser light (193 nm), electron beams and soft x-rays. The antireflective coating 104 can comprise a single layer or a plurality of different layers. Suitable antireflective materials and methods of formation are known in the art. Antireflective materials are commercially available, for example, those sold under the AR trademark by Rohm and Haas Electronic Materials LLC (Marlborough, Mass. USA), such as ART™40A and ART™124 antireflectants.

A first photosensitive composition is applied on the substrate over the antireflective layer 104 (if present) to form a first photosensitive layer 106. As used herein, the terms "photosensitive material(s)", "photosensitive composition(s)" and "photoresist(s)" are used interchangeably. Suitable photoresist materials are known in the art and include, for example, those based on acrylate, novolak and silicon chemistries. Suitable resists are described, for example, in U.S. Application Publication Nos. US20090117489 A1, US20080193872 A1, US20060246373 A1, US20090117489 A1, US20090123869 A1 and U.S. Pat. No. 7,332,616. The photoresist materials useful in the methods of the invention include both positive- and negative-acting materials. Suitable positive-acting materials include positive-acting chemically amplified photoresists which undergo a photoacid-promoted deprotection reaction of acid labile groups of one or more components of the composition to render exposed regions of a coating layer of the resist more soluble in an aqueous developer than unexposed regions. Typical photoacid-labile groups of the photoresist resins include ester groups that contain a tertiary non-cyclic alkyl carbon (e.g., t-butyl) or a tertiary alicyclic carbon (e.g., methyladamantyl) covalently linked to the carboxyl oxygen of the ester. Acetal photoacid-labile groups also are typical.

The photosensitive composition comprises a resin component and a photoactive component. The resin preferably has functional groups that impart alkaline aqueous developability to the resist composition. For example, typical are resin binders that comprise polar functional groups such as hydroxyl or carboxylate. The resin component is used in the composition in an amount sufficient to render an exposed layer of the composition developable in a developer solution, such as an aqueous alkaline solution. The resin component will typically comprise about 70 to about 97 wt % of total solids of the resist.

The photosensitive composition further comprises a photoactive component employed in an amount sufficient to generate a latent image in a coating layer of the composition upon exposure to activating radiation. For example, the photoactive component will suitably be present in an amount of from about 1 to 20 wt % of total solids of the resist. Typical photoactive components in the resist compositions are photoacid generators. Suitable PAGs are known in the art of chemically amplified photoresists and include, for example: onium salts, for example, triphenyl sulfonium salts, nitrobenzyl derivatives, sulfonic acid esters, diazomethane derivatives, glyoxime derivatives, sulfonic acid ester derivatives of an N-hydroxyimide compound and halogen-containing triazine compounds. One or more of such PAGs can be used.

A typical optional additive of the resists is an added base, particularly tetrabutylammonium hydroxide (TBAH), or tetrabutylammonium lactate, which can enhance resolution of a developed resist relief image. For resists imaged at 193 nm, a typical added base is a hindered amine such as diazabicyclo undecene or diazabicyclononene. The added base is suitably used in relatively small amounts, for example, about 0.03 to 5 wt % relative to the total solids.

Photoresists used in accordance with the invention also may contain other optional materials. For example, other optional additives include anti-striation agents, plasticizers and speed enhancers. Such optional additives typically will be present in minor concentrations in a photoresist composition except for fillers and dyes which may be present in relatively large concentrations, for example, in amounts of from about 0.1 to 10 wt % based on the total weight of a resist's dry components.

Suitable negative-acting resists typically will contain a crosslinking component. The crosslinking component is typically present as a separate resist component. Amine-based crosslinkers such as a melamine, for example, the Cymel melamine resins, are typical. Negative-acting photoresist compositions useful in the invention comprise a mixture of materials that will cure, crosslink or harden upon exposure to acid, and a photoactive component of the invention. Particularly useful negative acting compositions comprise a resin binder such as a phenolic resin, a crosslinker component and a photoactive component. Such compositions and the use thereof are disclosed in European Patent Nos. EP0164248B1 and EP0232972B1, and in U.S. Pat. No. 5,128,232. Typical phenolic resins for use as the resin binder component include novolaks and poly(vinylphenol)s such as those discussed above. Typical crosslinkers include amine-based materials, including melamine, glycolurils, benzoguanamine-based materials and urea-based materials. Melamine-formaldehyde resins are generally most typical. Such crosslinkers are commercially available, for example: the melamine resins sold by Cytec Industries under the trade names Cymel 300, 301 and 303; glycoluril resins sold by Cytec Industries under the trade names Cymel 1170, 1171, 1172; urea-based resins sold by Teknor Apex Company under the trade names Beetle 60, 65 and 80; and benzoguanamine resins sold by Cytec Industries under the trade names Cymel 1123 and 1125. For imaging at sub-200 nm wavelengths such as 193 nm, typical negative-acting photoresists are disclosed in International Application Pub. No. WO 03077029.

The photoresists useful in the invention are generally prepared following known procedures. For example, a resist can be prepared as a coating composition by dissolving the components of the photoresist in a suitable solvent, for example, a glycol ether such as 2-methoxyethyl ether (diglyme), ethylene glycol monomethyl ether, propylene glycol monomethyl ether; propylene glycol monomethyl ether acetate; lactates such as ethyl lactate or methyl lactate; propionates, particularly methyl propionate, ethyl propionate and ethyl ethoxy propionate; a Cellosolve ester such as methyl Cellosolve acetate; an aromatic hydrocarbon such toluene or xylene; or a ketone such as methylethyl ketone, cyclohexanone and 2-heptanone. Typically the solids content of the photoresist varies between about 2 and 25 wt % based on the total weight of the photoresist composition. Blends of such solvents also are suitable.

The methods of the invention can be used with a variety of imaging wavelengths, for example, radiation having a wavelength of sub-400 nm, sub-300 or sub-200 nm exposure wavelength, with I-line (365 nm), 248 nm and 193 nm being typical exposure wavelengths, as well as EN and 157 nm. In an exemplary aspect, the photoresists are suitable for use with and imaged at a sub-200 nm wavelength such as 193 nm. At such wavelengths, the use of immersion lithography is typical although dry processing can be used. In immersion lithography, a fluid (i.e., an immersion fluid) having a refractive index of between about 1 and about 2 is maintained between an exposure tool and the photoresist layer during exposure. A topcoat layer is typically disposed over the photoresist layer to prevent direct contact between the immersion fluid and photoresist layer to avoid leaching of components of the photoresist into the immersion fluid.

The photosensitive composition can be applied to the substrate by spin-coating, dipping, roller-coating or other conventional coating technique. Of these, spin-coating is typical. For spin-coating, the solids content of the coating solution can be adjusted to provide a desired film thickness based upon the specific coating equipment utilized, the viscosity of the solution, the speed of the coating tool and the amount of time allowed for spinning. A typical thickness for the first photosensitive layer 106 is from about 500 to 1500 Å. The first photosensitive layer can next be softbaked to minimize the solvent content in the layer, thereby forming a tack-free coating and improving adhesion of the layer to the substrate. The softbake can be conducted on a hotplate or in an oven, with a hotplate being typical. The softbake temperature and time will depend, for example, on the particular material of the photosensitive layer and thickness. Typical softbakes are conducted at a temperature of from about 90 to 150° C., and a time of from about 30 to 90 seconds.

If the first photosensitive layer 106 is to be exposed with an immersion lithography tool, for example a 193 nm immersion scanner, a topcoat layer (not shown) can be disposed over the photosensitive layer 106. Use of such a topcoat layer can act as a barrier between the immersion fluid and underlying photosensitive layer. In this way, leaching of components of the photosensitive composition into the immersion fluid, possibly resulting in contamination of the optical lens and change in the effective refractive index and transmission properties of the immersion fluid, can be minimized or avoided. Suitable topcoat compositions are commercially available, for example, OPTICOAT™ topcoat materials such as OC™ 2000 (Rohm and Haas Electronic Materials) and otherwise known in the art, for example, those described in U.S. Patent Application Pub. No. 2006/0246373A1 and in U.S. Provisional Application Nos. 61/204,007, filed Dec. 31, 2008. Such compositions can be applied over the photosensitive layer by any suitable method such as described above with reference to the photosensitive compositions, with spin coating being typical. The topcoat layer thickness is typically $\lambda/4n$ (or an odd multiple thereof), wherein $\lambda$ is the wavelength of the exposure radiation and n is the refractive index of the topcoat layer. If a topcoat layer is present, the first photosensitive layer 106 can be softbaked after the topcoat layer composition has been applied rather than prior to topcoat application. In this way, the solvent from both layers can be removed in a single thermal treatment step.

The first photosensitive layer 106 is next exposed to activating radiation 108 through a first photomask 110 to create a difference in solubility between exposed and unexposed regions. For a positive-acting material, as illustrated, the photomask has optically transparent and optically opaque regions, the optically transparent regions corresponding to regions of the photosensitive layer to be removed in a subsequent development step. For negative-acting materials, the optically opaque regions would correspond with portions of the resist layer to be developed away. The exposure energy is typically from about 1 to 100 mJ/cm², dependent upon the exposure tool and the components of the photosensitive composition. References herein to exposing a photosensitive composition to radiation that is activating for the composition indicates that the radiation is capable of forming a latent image in the photosensitive composition such as by causing a reaction of the photoactive component, for example, by producing photoacid from a photoacid generator compound. The photosensitive compositions are typically photoactivated by a short exposure wavelength, particularly a sub-400 nm, sub-300 or sub-200 nm exposure wavelength, with I-line (365 nm), 248 nm and 193 nm being typical exposure wavelengths, as well as EUV and 157 nm.

Following exposure of the first photosensitive layer 106, a post-exposure bake (PEB) of the photosensitive layer is performed at a temperature above the softening point of the layer. The PEB can be conducted, for example, on a hotplate or in an oven. Conditions for the PEB will depend, for example, on the particular material of the photosensitive layer and thickness. The PEB is typically conducted at a temperature of from about 80 to 150° C., and a time of from about 30 to 90 seconds.

The exposed photosensitive layer 106 is next developed to form a first resist pattern 106' as shown in FIG. 1B. While the developer material will depend on the particular material of the photosensitive layer 106, suitable developers and development techniques are known in the art. Typical developers include, for example, aqueous base developers such as quaternary ammonium hydroxide solutions, for example, tetra-alkyl ammonium hydroxide solutions such as 0.26 N tetramethylammonium hydroxide.

Following development, the first resist pattern 106' is heat-treated in a first hardbake process to further remove solvent from the resist and to form a hardened resist pattern 106", as shown in FIG. 1C. The hardbake is typically conducted with a hot plate or oven, and is typically conducted at a temperature of about 150° C. or higher, for example, from about 170 to 180° C., and a time of from about 30 to 120 seconds.

With reference to FIG. 1D, the hardbaked first resist pattern 106" is treated with a material effective to make alkaline a surface of the first resist pattern. The alkaline surface interferes with reaction during exposure of a subsequently applied photosensitive layer over the resist pattern. For example, in the case of a positive-acting photosensitive layer, acid-catalyzed deprotection reaction is prevented in regions in the immediate vicinity of the underlying alkaline-treated resist pattern. As a consequence, portions of the photosensitive layer would remain in those regions after development.

While not limited thereto, particularly suitable materials for the surface treatment comprise an alkaline material and a surfactant which is different from the alkaline material. It is believed that the surfactant promotes formation of a substantially uniform coating layer of the second resist over the alkaline material treated resist pattern.

The alkaline material can take various forms, and may be in the form of a solution formed by dissolving a solid compound in a suitable solvent. Suitable alkaline materials for the resist pattern treatment include, for example, aqueous base developers such as quaternary ammonium hydroxide solutions, for example, tetra-alkyl ammonium hydroxide solutions such as 0.26 Normality (N) (2.38 wt %) tetramethylammonium hydroxide (TMAH). Solvent materials used for the alkaline material and otherwise in the compositions should not dissolve or minimize dissolution of the underlying photoresist The alkaline material (absent any solvent, e.g., water, alcohol or the like) is typically present in the compositions in an amount of from about 1 to 10 wt %, based on the total composition.

Suitable surfactants for the resist pattern treatment compositions include those which exhibit an amphiphilic nature, meaning that they can be both hydrophilic and hydrophobic at the same time. Amphiphilic surfactants possess a hydrophilic head group or groups, which have a strong affinity for water and a long hydrophobic tail, which is organophilic and repels water. Suitable surfactants can be ionic (i.e., anionic, cationic) or nonionic. Further examples of surfactants include silicone surfactants, poly(alkylene oxide) surfactants, and fluorochemical surfactants. Suitable non-ionic surfactants for use in the aqueous solution include, but are not limited to, octyl and nonyl phenol ethoxylates such as TRITON® X-114, X-100, X-45, X-15 and branched secondary alcohol ethoxylates such as TERGITOL™ TMN-6 (The Dow Chemical Company, Midland, Mich. USA). Still further exemplary surfactants include alcohol (primary and secondary) ethoxylates, amine ethoxylates, glucosides, glucamine, polyethylene glycols, poly(ethylene glycol-co-propylene glycol), or other surfactants disclosed in *McCutcheon's Emulsifiers and Detergents*, North American Edition for the Year 2000 published by Manufacturers Confectioners Publishing Co. of Glen Rock, N.J.

Nonionic surfactants that are acetylenic diol derivatives also can be suitable, including such surfactants of the following formulae:

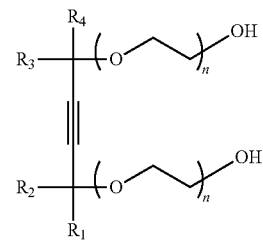

I

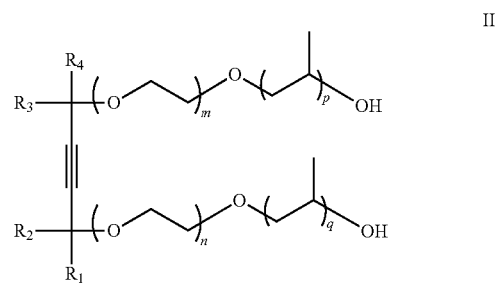

II wherein $R_1$ and $R_4$ are a straight or a branched alkyl chain having from 3 to 10 carbon atoms; $R_2$ and $R_3$ are either H or an alkyl chain suitably having from 1 to 5 carbon atoms; and m, n, p, and q are numbers that range from 0 to 20. Such surfactants are commercially available from Air Products and Chemicals, Inc. of Allentown, Pa. trade names of SURFYNOL® and DYNOL®.

Additional suitable surfactants for use in coating compositions of the invention include other polymeric compounds such as the tri-block EO-PO-EO co-polymers PLURONIC® 25R2, L121, L123, L31, L81, L101 and P123 (BASF, Inc.).

Particularly suitable surfactants include amines, typically primary and secondary amines, i.e., an amine including one or more primary amine groups and one or more secondary amine groups, respectively, and combinations thereof. Tertiary amine groups can be present in addition to the primary and/or secondary amine groups. Typically, the amine is a multifunctional amine. The amine can be a polyamine, such as a diamine, triamine or tetra-amine. Suitable primary amines include compounds of the following formula (I):

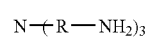

(I)

wherein R is chosen from optionally substituted alkyl such as optionally substituted C1 to C6 alkyl, such as methyl, ethyl or propyl, with ethyl being typical. Other suitable primary amines include poly(allyl amines) represented by the following formula (II):

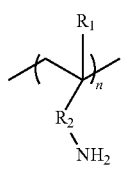
(II)

wherein: $R_1$ is chosen from hydrogen and optionally substituted alkyl such as C1 to C3 alkyl; $R_2$ is chosen from optionally substituted alkylene such as C1 to C6 alkylene, typically methylene or ethylene; and n is an integer greater than or equal to 3. In an exemplary primary amine of the formula (N-II), $R_1$ is hydrogen and $R_2$ is methylene. Other suitable amines include those represented by the following general formulae (III), (IV) and (V):

(III)

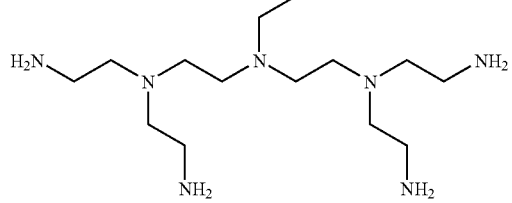
(IV)

(V)

wherein $R_1$ and $R_2$ are each independently a hydrogen atom or an alkyl group with 1 to 10 carbon atoms, and n is an integer from 1 to 10. Other suitable amines include the following:

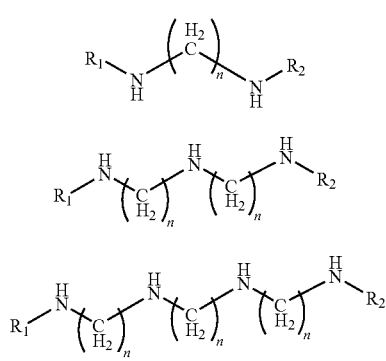
A-1

A-2

A-3

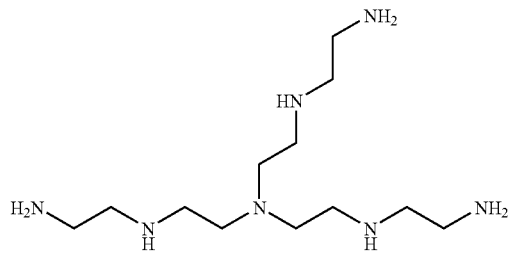
A-4

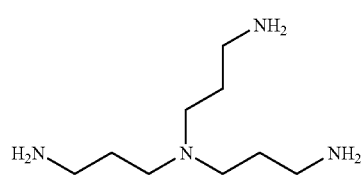
A-5

A-6

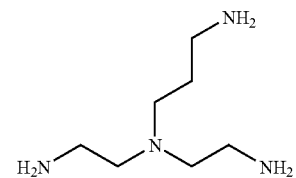
A-7

A-8

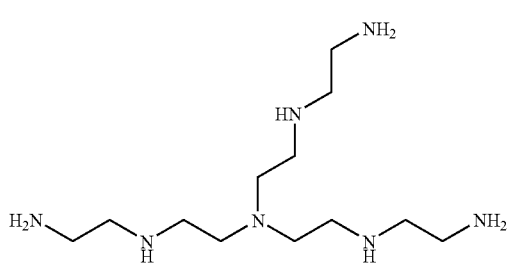
A-9

Of these, tris(2-aminoethyl)amine (TAEA) is particularly preferred.

The surfactant is typically present in the compositions in a relatively small amount, for example, from 0.01 to 5 wt %, for example, from 0.01 to 1 wt %, based on the weight of total solids in the composition (total solids being all compositions components except solvent carrier).

The resist pattern treatment compositions can comprise one or more optional components in addition to the alkaline material and surfactant components. For example, the compositions can include one or more solvent in addition to any solvent used for the alkaline material and surfactant. As described above, solvent materials used for the alkaline material and otherwise in the compositions should not dissolve or minimize dissolution of the underlying photoresist. Suitable solvents will therefore depend on the particular underlying resist material and may include, for example, water and alcohols such as n-butanol. The optional components also include one or more base generator compound, such as a thermal base generator compound and/or a photobase generator compound.

The photoresist pattern treatment compositions can be prepared by admixture in any order of the alkaline material and surfactant components, and any additional components such as solvent and base generator compounds. One or more of the components can be added as a solid or as a pre-mixed solution using a suitable solvent.

Preferably, the alkaline treatment includes treatment with a quaternary ammonium hydroxide and an amine. The quaternary ammonium hydroxide material and amine can be simultaneously applied to the substrate, for example, either from a premixed composition or by applying the materials simultaneously but separate from one another in which case the composition is formed in situ. Preferably, the quaternary ammonium hydroxide material and amine are sequentially applied in that order. The quaternary ammonium hydroxide and amine materials can be applied as a liquid, gas or vapor, and can be applied, for example, by spin-coating, dipping, vapor-coating, chemical vapor deposition (CVD) or other conventional coating technique. Of these, spin-coating of liquid materials is typical. Typically, the quaternary ammonium hydroxide and amine materials can be applied as aqueous solution(s). Where the quaternary ammonium hydroxide and amine are applied simultaneously, the surface treated substrate can be rinsed, for example, with deionized water. Where the quaternary ammonium hydroxide and amine materials are sequentially applied, the amine can be applied as an aqueous solution, functioning also as a water rinse. The surface treated substrate can optionally be rinsed, for example, with deionized water to remove excess composition.

A critical dimension (CD) of the first resist pattern 106" becomes slightly reduced as a result of the surface treatment as compared with the original CD of resist pattern 106'. This CD loss is believed to be attributed to further development of the first resist pattern during the surface treatment. The surface treatment forms a modified first resist pattern surface 112 which is alkaline and which has a line width roughness less than that of the pre-treated surface.

Following the surface treatment, the substrate can optionally be heat-treated in a second hardbake process. As discussed below in more detail below, dimensions of the first resist pattern resulting from the process can be accurately adjusted and controlled by selection of appropriate conditions of the second hardbake. This heat-treatment process is typically conducted on a hotplate or in an oven, and conditions will depend, for example, on the particular material and thickness of the resist pattern, and the desired change in CD of the pattern. Typical conditions for the optional heat treatment include a temperature of from about 120 to 200° C. and a time of from about 60 to 120 seconds.

A second photosensitive composition as described above is coated over the first resist pattern 106" and BARC layer 104 to form a second photosensitive layer 114, as shown in FIG. 1E. The second photosensitive composition can be the same or different from the first photosensitive composition and, except as otherwise stated, can be applied and processed in the same manner including the materials and conditions described above with respect to the first photosensitive layer. While the tone of the first photosensitive composition can be positive- or negative-acting, the tone of the second photosensitive composition is positive-acting. Generally, selection for this composition will depend on the particular application and geometries involved. In the illustrated method, both the first and second photosensitive compositions are positive acting.

The second photosensitive layer 114 can next be softbaked. If the second photosensitive layer 114 is to be exposed with an immersion lithography tool, a topcoat layer (not shown) as described above can be disposed over the second photosensitive layer 114. If a topcoat layer is used, the second photosensitive layer 114 can be softbaked after the topcoat layer composition has been applied rather than prior to its application.

With reference to FIG. 1(F), the second photosensitive layer 114 is selectively exposed to activating radiation 108 through a second photomask 116 which has optically opaque regions corresponding to portions of the second photosensitive layer to remain after development. The alkaline-modified surface region 112 of the first resist pattern 106" prevents photoreaction in the second resist layer 114 in the vicinity of the surface region. As a result, a layer 114' of the unreacted second photosensitive composition remains over the first resist pattern 106". The exposed second photosensitive layer 114 is heat-treated in a post-exposure bake and developed, leaving behind layer 114a' of the unreacted second photosensitive composition over the first resist pattern 106" and resist lines 114b' to form a second resist pattern disposed between lines of the first resist pattern 106", as depicted in FIG. 1G. The resulting developed image of the first resist pattern has an improved (i.e., reduced) surface roughness as compared with that following earlier development of the first photoresist layer.

Following development of the second photosensitive layer, the BARC layer 104 is selectively etched using the first and second resist patterns 106", 114a' and 114b' simultaneously as an etch mask, exposing the underlying hardmask layer 103. The hardmask layer is next selectively etched, again using the first and second resist patterns simultaneously as an etch mask, resulting in patterned BARC and hardmask layers 104', 103', as shown in FIG. 1H. Suitable etching techniques and chemistries for etching the BARC layer and hardmask layer are known in the art and will depend, for example, on the particular materials of these layers. Dry-etching processes such as reactive ion etching are typical. The first and second resist patterns and patterned BARC layer 104' are next removed from the substrate using known techniques, for example, an oxygen plasma ashing. Using the hardmask pattern 103' as an etch mask, the one or more layers 102 are then selectively etched. Suitable etching techniques and chemistries for etching the underlying layers 102 are known in the art, with dry-etching processes such as reactive ion etching being typical. The patterned hardmask layer 103' can next be removed from the substrate surface using known techniques, for example, a dry-etching process such as reactive ion etching. The resulting double patterned structure is a pattern of etched features 102' as illustrated in FIG. 1I. In an alternative exemplary method, it may be desirable to pattern the layer 102 directly using the modified first photoresist pattern 106" and second pattern 114b' without the use of a hardmask layer 103. Whether direct patterning with the resist patterns can be employed will depend on factors such as the materials involved, resist selectivity, resist pattern thickness and pattern dimensions.

It should be clear to the skilled person, that the above-described processes are not limited to double exposure single etch double patterning, but can be applied to triple exposure single etch triple patterning, or even higher order multiple exposure patterning processes by application and patterning of additional photoresist layers with repetition of a series of steps in the process as indicated by the dashed line one or more times beginning with the first hardbake through development of the additional photosensitive layer.

Figure 2:
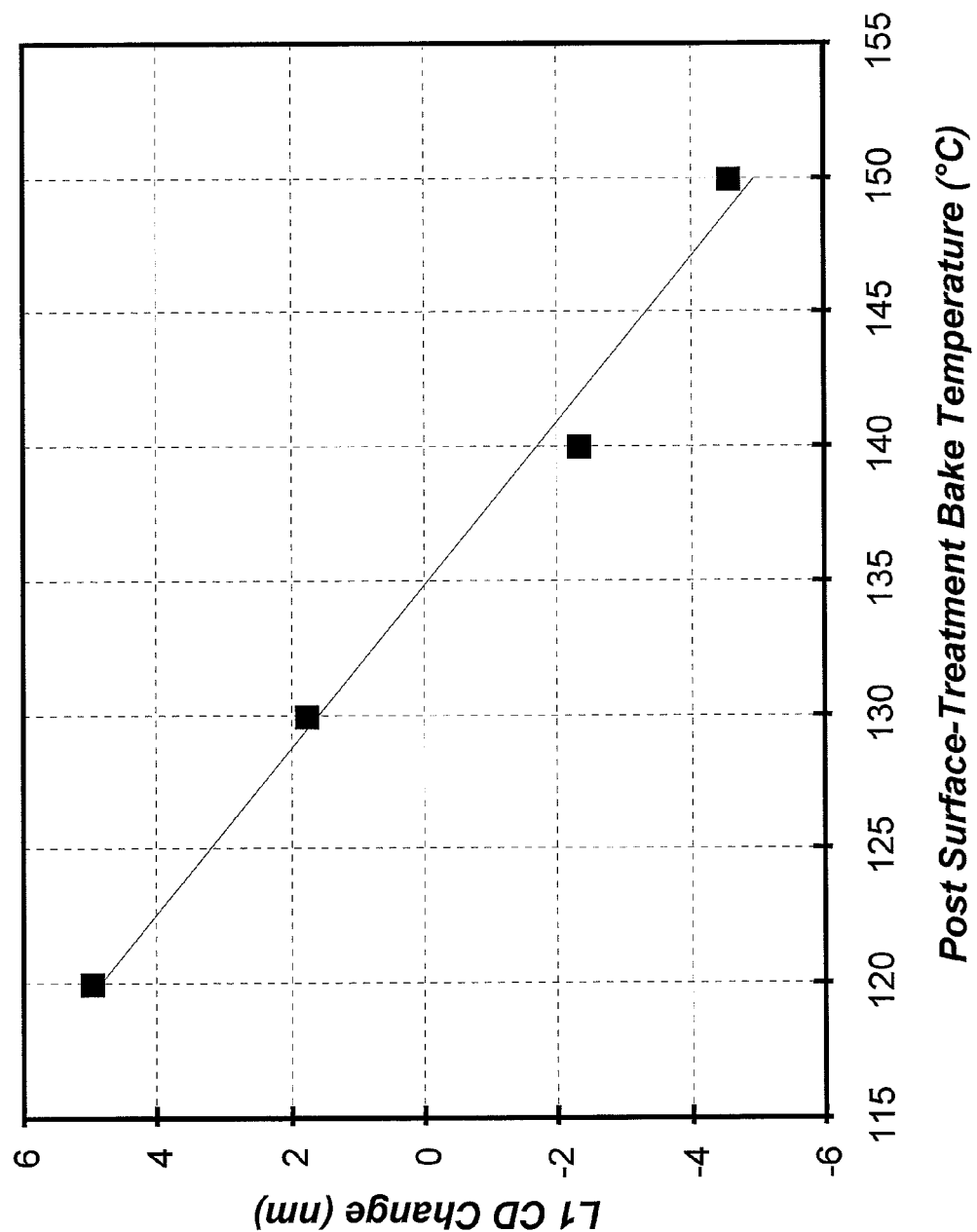
FIG. 2 is a graph showing the effect of post surface-treatment bake temperature on the change in dimension of a lithographic pattern in methods in accordance with the invention.

With reference to FIG. 2, it has been found that the CD of the first resist pattern following development of the second resist layer 114 decreases with an increase in the second hardbake (after alkaline surface treatment) temperature and increases with a decrease in the second hardbake temperature as compared with the CD prior to the surface treatment process. Based on this finding, it is possible to precisely control CD growth of the first resist pattern with the second hardbake process by selection of appropriate second hardbake conditions. More specifically, one can select an appropriate bake temperature which would result in a desired increase, decrease or no change in the CD. While the exact relationship between change in CD and hardbake temperature will depend on the particular materials used for the first resist pattern, surface treatment chemistry and second photoresist composition, FIG. 2 is illustrative of the general relationship. As a result of this relationship, it is possible to further adjust the dimensions of the resist pattern obtained after development of the second resist layer by repeating the processes described above beginning with first hardbake through development, as indicated by the dashed arrow in FIG. 1. The sequence can be repeated one or more times to obtain a desired CD for the first resist pattern.

The invention can be applied to a variety of situations in the manufacture of electronic devices. For example, the invention finds particular use as the basis for double or higher order patterning (or pitch-splitting) such as double, triple or higher order exposure single etch double patterning and in improving resist pattern line width roughness. Resist patterns can be controllably trimmed or widened as desired.

The methods of the invention involve treating a formed resist pattern with a material effective to render alkaline a surface of the resist pattern. While not limited thereto, exemplary materials for treating the resist patterns are described below.

The following non-limiting examples are illustrative of the invention.

EXAMPLES

Comparative Example 1, Examples 1-6

L1 Resist Polymer (Poly(IAM/α-GBLMA/ODOTMA/HAMA)) Synthesis 10.51 grams (g) of 2-methyl-acrylic acid 1-isopropyl-adamantanyl ester (IAM), 6.82 g of 2-methyl-acrylic acid 2-oxo-tetrahydro-furan-3yl ester (α-GBLMA), 6.36 g of 2-methyl-acrylic acid 3-oxo-4,10-dioxa-tricyclo[5.2.1.0$^{2,6}$]dec-8-yl ester (ODOTMA) and 6.31 g of 2-methyl-acrylic acid 3-hydroxy-adamantanyl ester (HAMA) were dissolved in 27 g of tetrahydrofuran (THF). The mixture was degassed by bubbling with nitrogen for 20 minutes. A 500 ml flask equipped with a condenser, nitrogen inlet and mechanical stirrer was charged with 11 g of THF, and the solution was brought to a temperature of 67° C. 5.23 g of dimethyl-2,2-azodiisobutyrate (17 mol % based on total monomers) was dissolved in 5 g of THF and charged into the flask. The monomer solution was fed into a reactor at a rate of 16.0 milliliters per hour (mL/h) for 3 hours 30 minutes. The polymerization mixture was then stirred for an additional 30 minutes at 67° C. 5 g of THF was next added to the reactor and the polymerization mixture was cooled to room temperature. Precipitation was carried out in 1.0 L of isopropyl alcohol. After filtration, the polymer was dried, re-dissolved in 50 g of THF, re-precipitated into 1.1 L of isopropyl alcohol, filtered and dried in a vacuum oven at 45° C. for 48 hours, resulting in 25.4 g of the poly(IAM/α-GBLMA/ODOTMA/HAMA) polymer (Mw=7,934 and Mw/Mn=~1.46) shown below:

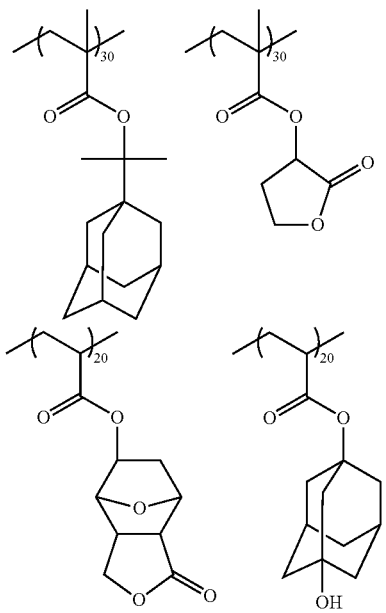

L1 Resist Formulation 3.169 g of the polymer formed as described above was dissolved in 96.38 g of a solvent mixture of 70 wt % propylene glycol monomethyl ether acetate (PGMEA) and 30 wt % cyclohexanone. To this mixture was added 0.405 g of triphenylsulfonium (adamantan-1yl methoxycarbonyl)-difluoro-methanesulfonate, 0.041 g of 1-(tert-butoxycarbonyl)-4-hydroxypiperidine and 0.005 g of POLYFOX® PF-656 surfactant (Omnova Solutions Inc.). The resulting mixture was rolled on a roller for six hours and then filtered through a Teflon filter having a 0.2 micron pore size, thereby forming a positive-acting photoresist composition.

Surface Treatment Solution Formulation

A surface treatment solution was prepared by adding 0.01 g of (TAEA) (Sigma-Aldrich) to 99.99 g of a surfactant solution (OptiPattern™ Clear-I, Air Products and Chemicals, Inc., Allentown, Pa., USA). The resulting solution was filtered through a nylon filter having a 0.1 micron pore size.

Wafer Preparation 300 mm silicon wafers were spin-coated with AR™40A antireflectant (Rohm and Haas Electronic Materials) to form a first bottom antireflective coating (BARC) on a TEL CLEAN TRACK™ LITHIUS™ i+ coater/developer. The first BARC-coated wafers were baked for 60 seconds at 215° C. to yield a first BARC film thickness of 75 nm. A second BARC layer was coated over the first BARC using AR™124 antireflectant (Rohm and Haas Electronic Materials). The wafers were baked at 205° C. for 60 seconds to generate a 23 nm top BARC layer. These wafers were used for subsequent patterning of the first lithography (L1) images as described below.

First Lithography (L1)

Figure 3:
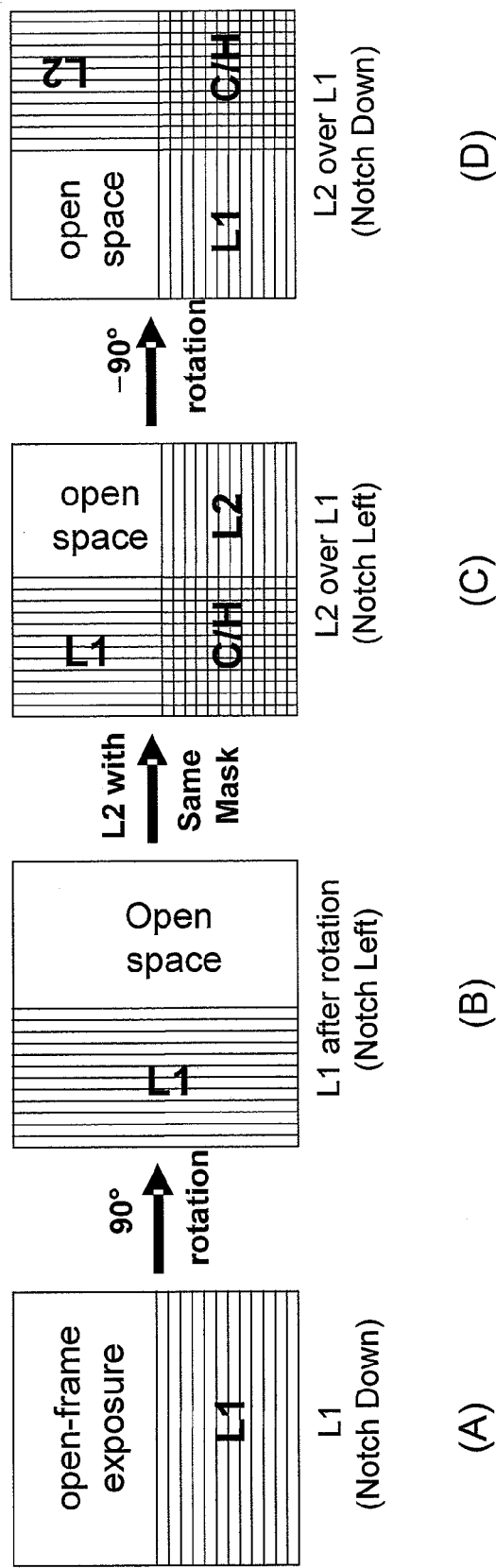
FIG. 3 illustrates a photomask and exposure technique for forming dual-layer cross-line structures on a semiconductor wafer.

The L1 resist formulation was coated on the dual BARC-coated wafers and soft-baked at 110° C. for 60 seconds on the coater/developer to provide a first resist layer thickness of 950 Å. A topcoat layer was formed over the first resist layer and exposed through a binary reticle having line and space patterns as shown in FIG. 3 using an ASML TWINSCAN™ XT:1900i immersion scanner with a numerical aperture of 1.35 and dipole illumination (0.89 outer sigma/0.76 inner sigma). The critical dimension (CD) on the reticle included 45 nm lines at 90 nm pitch (45 nm 1:1 lines and spaces). The reticle was oriented such that the patterned lines and spaces were in a horizontal direction in each die as illustrated in FIG. 3A. Various CDs were printed on the wafer at a 90 nm pitch with different exposure doses of from 16 to 38 mJ/cm². The die were imaged with a fixed depth of focus and an incremental change of exposure dose such that within each row, the exposure dose increased from left to right with the notch on the wafer in the down position. The wafers were then post-exposure baked (PEB) at 100° C. for 60 seconds and developed for 12 seconds using Microposit™ MF CD-26 developer (Rohm and Haas Electronic Materials) to render L1 patterns.

Curing and Surface Treatment

The L1-patterned wafers were subjected to a curing bake process at 180° C. for 60 seconds for a subsequent second lithography process. The thermally cured wafers were, except for Comparative Example 1, treated with the surface treatment solution on the wafer track with wafer rotation, and then hard-baked at various temperatures, as shown in FIG. 4.

Second Lithography (L2)

The L1-patterned wafers were next coated with EPIC™ 2098 photoresist (Rohm and Haas Electronic Materials) and soft-baked at 110° C. for 60 seconds on the coater/developer, resulting in a film thickness of 650 Å as measured on a bare silicon wafer. A topcoat layer was formed over the second resist layer. The topcoat and second resist layers were exposed and developed to generate second (L2) resist patterns using the same scanner settings and reticle as in the L1 process, the only difference being that the wafers were rotated by 90 degrees with respect to the L1 orientation, as shown in FIG. 3B-C. The resulting L2 patterns were oriented in the vertical direction in each die with the notch down, thereby forming a cross grid together with the lines and spaces in the L1 patterns which were oriented in the horizontal direction, as shown in FIG. 3D.

Metrology

After double patterning the wafers, CDs of the wafers were measured on a CG 4000 SEM (Hitachi High Technologies America, Inc). Three areas were inspected on each die: (1) L1 patterns flood-exposed during the L2 process (bottom-left corner of the die); (2) L2 patterns printed in an open space after L1 (top-right corner of the die); and (3) contact hole area where L1 and L2 lines cross (bottom-right corner of the die).

The results are summarized in the table shown in FIG. 4, which includes SEM images and CD measurement data. The L1 and L2 images were obtained at L1 and L2 exposure doses of 22 mJ/cm² and 23 mJ/cm², respectively. The contact hole images were obtained at an L1 and L2 dose of 22 mJ/cm² and 23 mJ/cm², respectively. The original L1 images exhibited a CD of 49.0 nm before curing and 47.6 nm after curing at 180° C. for 60 seconds due to thermal shrinkage. Comparative Example 1, which uses purely thermal curing, shows significant shrinkage of the L1 patterns after double patterning. L1 CD was measured at 41.6 nm with 6 nm shrinkage from the cured L1 CD before double patterning. Although there was shrinkage of L1 patterns during the double patterning process, successful double patterning results were obtained. Example 1 demonstrates the effect of surface treatment on L1 and contact hole CD. As can be seen, CD growth of about 10 nm was measured for the L1 patterns after double patterning with the alkaline-treated L1 patterns. Examples 2-6 demonstrate the effect of hardbake temperature after resist pattern-treatment on L1 and contact hole CD. For hardbake temperatures between 120 and 150° C., the L1 CD was found to vary substantially linearly with temperature at a rate of about 0.3 nm/° C. Based on these results, it is believed that the final contact hole CDs can be precisely controlled and adjusted using the alkaline-treatment and post-treatment hardbake processes.

Example 1 was further used to analyze line width roughness (LWR) effects of the resist-pattern treatment process. Following L1 exposure at 36 mJ/cm² and development, the line width and line width roughness of the L1 pattern was measured as 34.6 nm and 4.5 nm (3 sigma), respectively. Measurements were again made following L2 exposure at 16 mJ/cm² and development, with the resulting linewidth and line width roughness being 45.7 nm and 2.7 nm (3 sigma), respectively. Based on these results, L1 resist images can be overexposed to provide lines smaller than the target CD and then treated in accordance with the methods described herein to yield L1 lines with improved LWR at the target CD.

Examples 7-58

The procedures of Example 1 are repeated except the surface treatment solutions are prepared by adding together the components of Table 1 and filtering through a nylon filter having a 0.1 micron pore size. Contact hole images would be expected to result.

Examples 59-101

The procedures of Example 1 is repeated except: (1) for the second (L2) lithography exposure, the mask is not rotated but is shifted laterally by a distance of a half pitch so that the L2 lines are disposed between and at the center of the L1 lines; and (2) the surface treatment solutions are prepared by adding together the components of Table 1 and filtering through a nylon filter having a 0.1 micron pore size. Patterns of dense lines and spaces would be expected to result.

TABLE 1

| Ex. | Amine[1] | Surfactant[2] | Water (g) | Ex. | Amine | Surfactant | Water (g) |
|---|---|---|---|---|---|---|---|
| 7, 59 | A-1 (5 g) | S-1 (1 g) | 194 | 29, 81 | A-3 (1 g) | — | 99 |
| 8, 60 | A-1 (2.5 g) | — | 97.5 | 30, 82 | A-3 (1 g) | S-1 (1 g) | 98 |
| 9, 61 | A-1 (1 g) | — | 99 | 31, 83 | A-3 (2.5 g) | S-1 (1 g) | 96.5 |
| 10, 62 | A-1 (0.1 g) | — | 99.9 | 32, 84 | A-4 (1 g) | — | 99 |
| 11, 63 | A-1 (2.5 g) | S-2 (1 g) | 96.5 | 33, 85 | A-4 (1 g) | S-1 (1 g) | 98 |
| 12, 64 | A-1 (2.5 g) | S-1 (1 g) | 96.5 | 34, 86 | A-4 (2.5 g) | S-1 (1 g) | 96.5 |
| 13, 65 | A-1 (2.5 g) | S-1 (0.75 g) | 96.75 | 35, 87 | A-5 (1 g) | — | 99 |
| 14, 66 | A-1 (2.5 g) | S-1 (0.5 g) | 97 | 36, 88 | A-5 (1 g) | S-1 (1 g) | 98 |
| 15, 67 | A-1 (2.5 g) | S-3 (10 g) | 87.5 | 37, 89 | A-5 (2.5 g) | S-1 (1 g) | 96.5 |
| 16, 68 | A-1 (2.5 g) | S-4 (20 g) | 77.5 | 38, 90 | A-6 (1 g) | — | 99 |
| 17, 69 | A-1 (2.5 g) | S-5 (0.05 g) | 97.45 | 39, 91 | A-6 (1 g) | S-1 (1 g) | 98 |
| 18, 70 | A-1 (1 g) | S-1 (0.1 g) | 98.9 | 40, 92 | A-6 (2.5 g) | S-1 (1 g) | 96.5 |
| 19, 71 | A-1 (1 g) | S-1 (0.3 g) | 98.7 | 41, 93 | A-7 (1 g) | — | 99 |
| 20, 72 | A-1 (1 g) | S-1 (0.5 g) | 98.5 | 42, 94 | A-7 (1 g) | S-1 (1 g) | 98 |

TABLE 1-continued

| Ex. | Amine[1] | Surfactant[2] | Water (g) | Ex. | Amine | Surfactant | Water (g) |
|---|---|---|---|---|---|---|---|
| 21, 73 | A-1 (2.5 g) | S-1 (0.1 g) | 97.4 | 43, 95 | A-7 (2.5 g) | S-1 (1 g) | 96.5 |
| 22, 74 | A-1 (2.5 g) | S-1 (0.3 g) | 97.2 | 44, 96 | A-8 (1 g) | — | 99 |
| 23, 75 | A-1 (5 g) | S-1 (0.1 g) | 94.9 | 45, 97 | A-8 (1 g) | S-1 (1 g) | 98 |
| 24, 76 | A-1 (5 g) | S-1 (0.3 g) | 94.7 | 46, 98 | A-8 (2.5 g) | S-1 (1 g) | 96.5 |
| 25, 77 | A-1 (5 g) | S-1 (0.5 g) | 94.5 | 47, 99 | A-9 (1 g) | — | 99 |
| 26, 78 | A-2 (1 g) | — | 99 | 48, 100 | A-9 (1 g) | S-1 (1 g) | 98 |
| 27, 79 | A-2 (1 g) | S-1 (1 g) | 98 | 49, 101 | A-9 (2.5 g) | — | 96.5 |
| 28, 80 | A-2 (2.5 g) | S-1 (1 g) | 96.5 | | | | |

[1]Amines are 1 wt % solutions in water and have the structures as defined above;
[2]S-1 = Tergitol ™ TMN-6, 10 wt % in water (The Dow Chemical Company, Midland, MI, USA); S-2 = Triton ™ X-100, 10 wt % in water (The Dow Chemical Company); S-3 = Tetronics ™ 304, 10 wt % in water (BASF Corporation, Florham Park, NJ USA) S-4 = Tetronics ™ 1307 (BASF Corporation, Florham Park, NJ USA); S-5 = Surfynol ™ 2502 (Air Products and Chemicals, Inc., Allentown, PA, USA).

What is claimed is:

1. A method of forming an electronic device, comprising, in sequence:
   (a) providing a semiconductor substrate comprising one or more layers to be patterned;
   (b) applying a first layer of a first photosensitive composition over the one or more layers to be patterned, wherein the first photosensitive composition comprises a first resin component and a first photoactive component;
   (c) exposing the first layer to activating radiation through a patterned photomask;
   (d) developing the exposed first layer to form a first resist pattern;
   (e) heat treating the first resist pattern in a hardbake process;
   (f) treating the hardbaked first resist pattern in a spin coating process with a material effective to make alkaline a surface of the first resist pattern;
   (g) applying a second layer of a second photosensitive composition over the one or more layers to be patterned and in contact with the alkaline surface of the first resist pattern, wherein the second photosensitive composition comprises a second resin component and a photoacid generator and is positive-acting;
   (h) exposing the second layer to activating radiation through a patterned photomask; and
   (i) developing the exposed second layer to form a second resist pattern.

2. The method of claim 1, wherein the first and second resist patterns each comprise a plurality of lines.

3. The method of claim 2, wherein a plurality of lines of the second resist pattern cross a plurality of lines of the first resist pattern.

4. The method of claim 3, wherein the first and second resist patterns define a plurality of contact hole patterns.

5. The method of claim 2, wherein adjacent lines of the second resist pattern are disposed between respective adjacent lines of the first resist pattern.

6. The method of claim 1, wherein the first hardbake process is conducted at a temperature of about 150° C. or higher.

7. The method of claim 1, further comprising heat-treating the hardbaked first resist pattern after the step of treating with the material effective to make alkaline and before the step of applying the layer of the second photosensitive composition.

8. The method of claim 1, wherein treating the hardbaked first resist pattern with the material effective to make alkaline a surface of the first resist pattern comprises treating the first resist pattern with an alkaline material and a surfactant.

9. The method of claim 1, wherein treating the hardbaked first resist pattern with the material effective to make alkaline a surface of the first resist pattern comprises treating the first resist pattern with a primary or secondary amine.

10. The method of claim 9, wherein treating the hardbaked first resist pattern with the material effective to make alkaline a surface of the first resist pattern comprises sequentially treating the first resist pattern with a quaternary ammonium hydroxide solution followed by the primary or secondary amine.

* * * * *